United States Patent [19]

Sugano et al.

[11] 3,935,328

[45] Jan. 27, 1976

[54] METHOD FOR PROVIDING DIELECTRIC ISOLATION IN AN EPITAXIAL LAYER OF A COMPOUND SEMICONDUCTOR USING THE PLASMA OXIDATION

[75] Inventors: Takuo Sugano, Tokyo; Yoshifumi Mori, Ichikawa, both of Japan

[73] Assignee: Kentaro Hayashi, Tokyo, Japan

[22] Filed: Oct. 11, 1973

[21] Appl. No.: 405,733

[30] Foreign Application Priority Data
Oct. 12, 1972 Japan.............................. 47-102281

[52] U.S. Cl. ...................... 427/34; 427/90; 156/17
[51] Int. Cl.² ............................................ B05D 5/12
[58] Field of Search ............ 117/215, 217, 107, 29, 117/212, 201, 93.1 GD; 156/17; 148/187; 427/34, 90

[56] References Cited

UNITED STATES PATENTS

| 3,434,868 | 3/1969 | Jorgensen .................. 117/93.1 GD |
| 3,442,701 | 5/1965 | Lepselter ............................. 117/227 |
| 3,649,386 | 4/1968 | Murphy .............................. 148/175 |

OTHER PUBLICATIONS

H. Katto and Y. Koga; *Journal of the Electrochemical Society*, Oct. 1971; p. 1619.

*Primary Examiner*—Dennis E. Talbert, Jr.
*Assistant Examiner*—Charles R. Wolfe, Jr.
*Attorney, Agent, or Firm*—Sughrue, Rothwell, Mion, Zinn & Macpeak

[57] ABSTRACT

Method for providing dielectric isolation of an epitaxial layer of a compound semiconductor or for providing separation and protection of pn-junction of a compound semiconductor by applying plasma oxidation.

2 Claims, 12 Drawing Figures

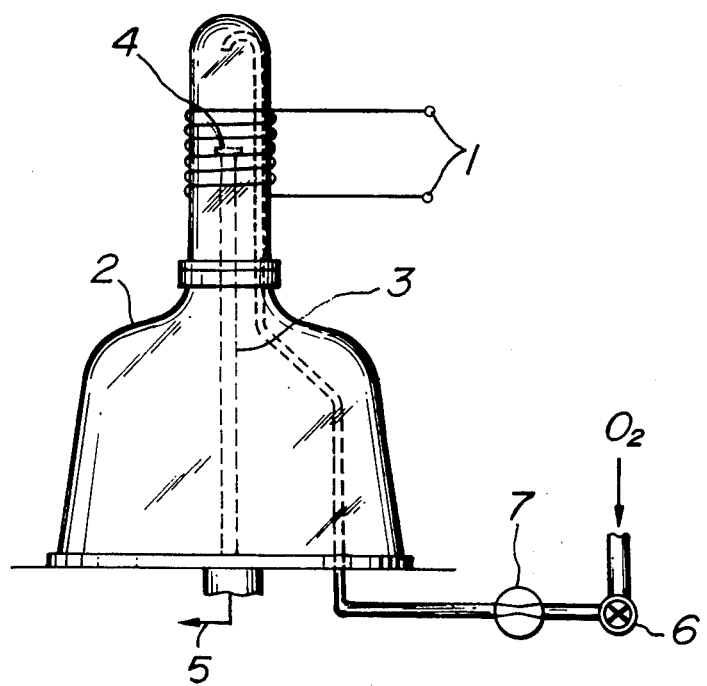
FIG_1

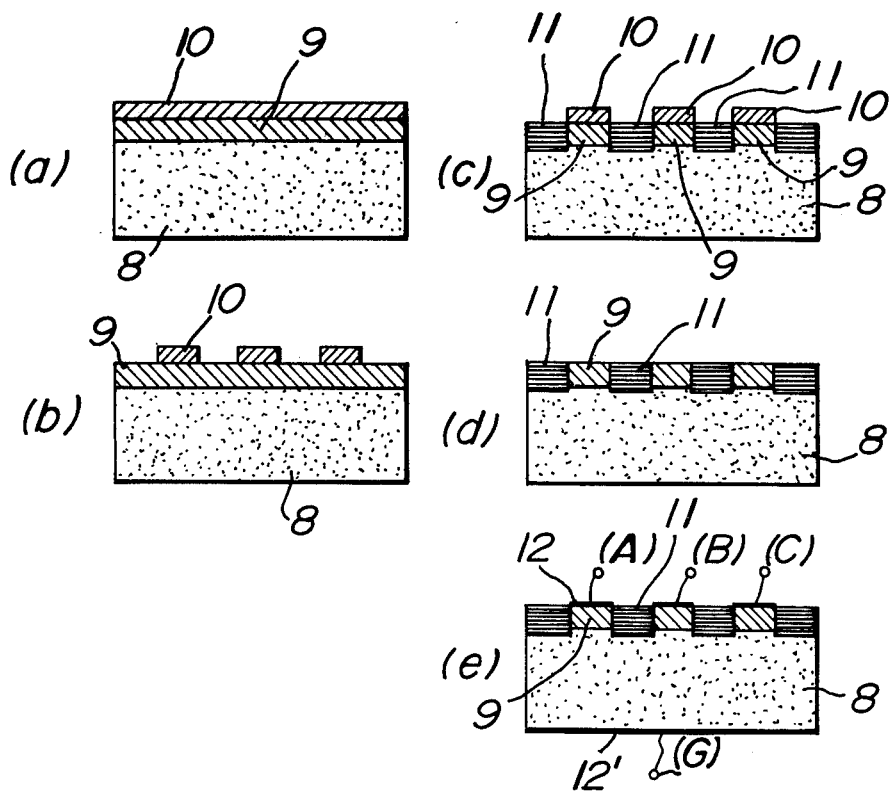

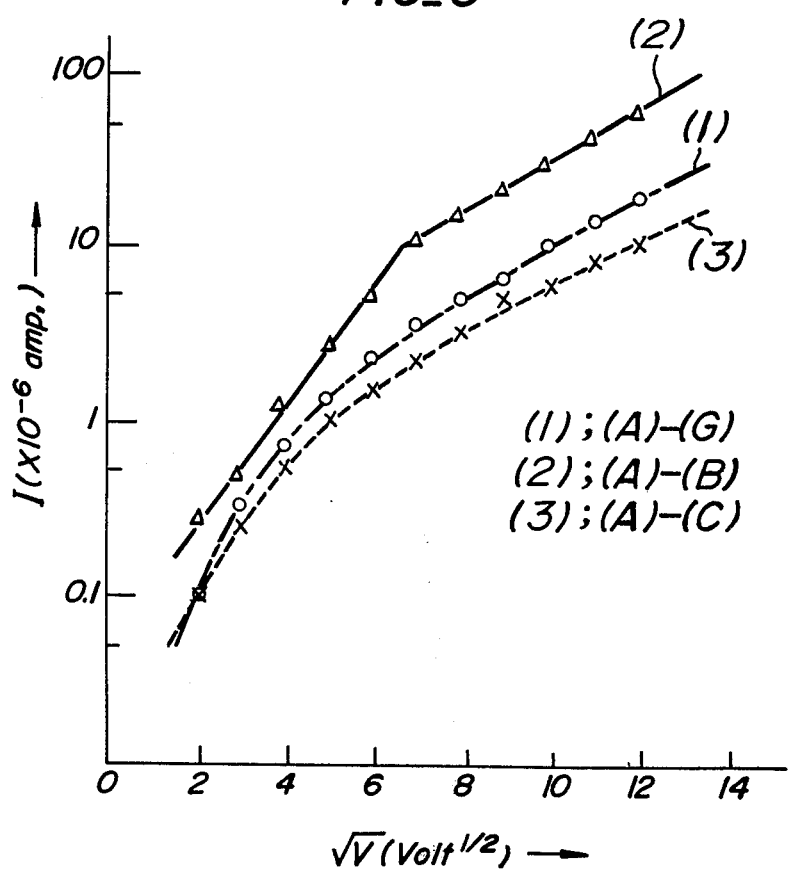

FIG_4
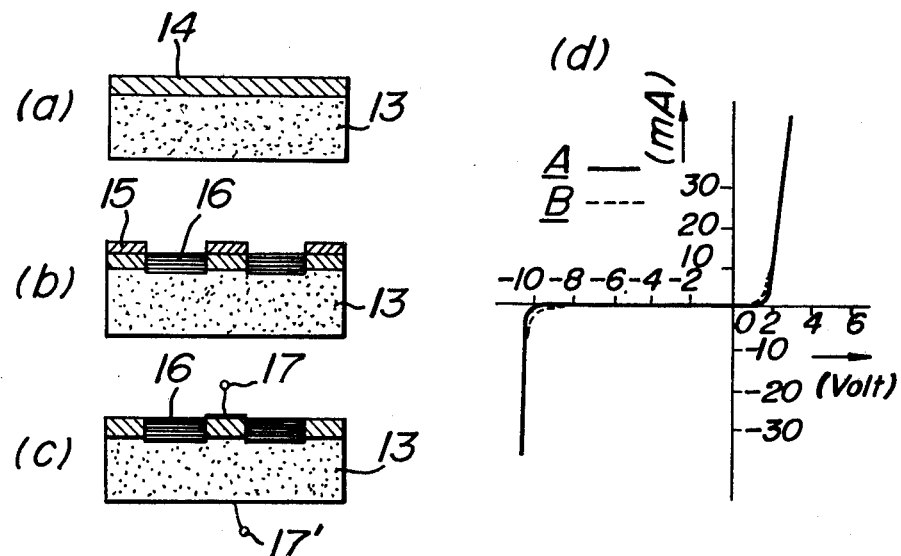
FIG_5
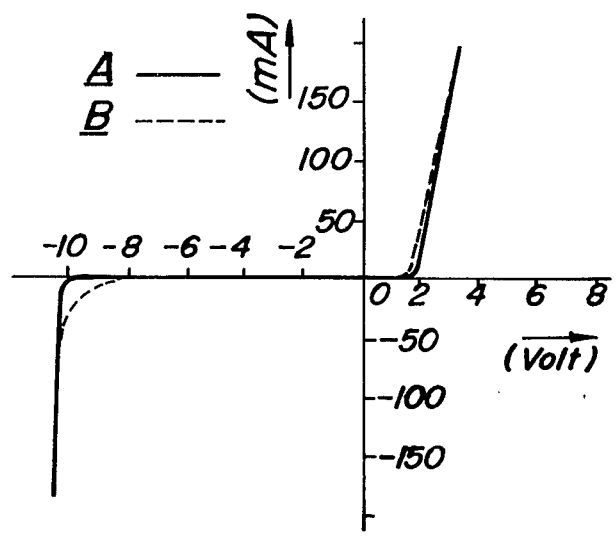

METHOD FOR PROVIDING DIELECTRIC ISOLATION IN AN EPITAXIAL LAYER OF A COMPOUND SEMICONDUCTOR USING THE PLASMA OXIDATION

BACKGROUND OF THE INVENTION

The present invention relates to a method for the provision of dielectric isolation in an epitaxial layer and for the isolation and protection of pn-junction of a compound semiconductor of an integrated circuit by selectively oxidizing the compound semiconductor by means of an oxidizing gas plasma.

The conventional method for the provision of such isolation and protection for the compound semiconductor element is to first provide a groove by mesa-type etching and thereafter chemically deposit silicon oxide ($SiO_2$) film thereon to passivate the surface. Such a conventional method involves considerable drawbacks in that the treatment, because of its complexity, sometimes decreases the reliability, the degree of integration and the yield. Furthermore compatibility with the other processes must be taken into account when the process is made in a chain of continuous processes.

SUMMARY OF THE INVENTION

The present invention has for its object to mitigate abovementioned problems in the method of isolation and protection of the epitaxial layer and pn-junction of a compound semiconductor. The method according to the present invention can be applied not only to the dielectric isolation and protection of pn-junction of an integrated circuit, but it may also be applied for the isolation and protection of hetero junction element and double hetero junction element.

In one embodiment of the method of the present invention, the surface of a substrate of gallium arsenide (GaAs) provided with 1-5 $\mu$ thick epitaxial layer of a gallium arsenide (GaAs) layer is first coated by an evaporated aluminum (Al) film. Thereafter the evaporated aluminum film at the location to be isolation layers is removed by a photoresist process. Then the sample is placed in a low pressure oxygen atmosphere of about 0.3 torr and by applying a high frequency power thereto to produce a low density plasma so that the exposed surface of the gallium arsenide (GaAs) is oxidized to produce a transparent insulating film of a polycrystalline structure with the resistivity of $10^8$–$10^{10}$ $\Omega$cm. The thickness of this film is microscopically measured to be of the order of 10 $\mu$ by means of an optical interference method. The oxide film penetrates the gallium arsenide (GaAs) epitaxial layer and the dielectric isolation is thus provided.

When an N-type gallium arsenide phosphide (GaAs$_{1-x}$P$_x$; $x$=0.4) substrate provided with P-type gallium arsenide phosphide (GaAs$_{1-x}$P$_x$; $x$=0.4) layer of 1-5 $\mu$ thick by diffusion is used, the aluminum layer is first coated thereon and then the film coating is removed from the portion to be oxidized by the aforementioned photoresist process and the isolation can be completed by applying the aforementioned treatment in an oxygen atmosphere of 0.4–0.6 torr.

BRIEF DESCRIPTION OF THE DRAWINGS

FIG. 1 is a schematic view of a reactor used for the manufacture of an insulating film on a compound semiconductor;

FIGS. 2a–2e are the cross-sectional views showing steps of providing isolation according to the present invention;

FIG. 3 shows a graph for showing voltage-current characteristics of the samples after above treatment;

FIGS. 4a–4c show cross-sectional views showing steps of providing the oxidized layer for surface passivation;

FIG. 4d shows voltage-current characteristics of the samples; and

FIG. 5 shows voltage-current characteristics of another sample treated by a method according to the present invention.

DESCRIPTION OF THE PREFERRED EMBODIMENT

For the better understanding of the method of the present invention, some typical embodiments will be explained by referring to the accompanied drawings.

FIG. 1 illustrates schematically a reactor used in the method of the present invention. In FIG. 1, 1 depicts a high frequency source which for instance generates a power of 420 KHz. A test piece 4 is placed on a quartz or an alumina tube 3 vertically arranged in a bell jar 2. The bell jar 2 must be sufficiently evacuated by means of a vacuum pump 5 which is shown just schematically. The vacuum atmospheric pressure is adjusted by introducing oxygen ($O_2$) gas from a source via a needle valve 6 and a stop valve 7, while continuing the evacuation. The vacuum pressure is selected to be about 0.3 torr when the test piece is gallium arsenide (GaAs) and about 0.4–0.6 torr when the test piece is gallium arsenide phosphide (GaAs$_{1-x}$P$_x$) or gallium phosphide (GaP). Thereafter, by applying a high frequency power a low density plasma may be produced instantaneously. The anode voltage is selected to be about 6–7 KV in case the test piece is gallium arsenide (GaAs), and about 8 KV in case the test piece is gallium arsenide phosphide (GaAs$_{1-x}$P$_x$) or gallium phosphide (GaP). The temperature of the low density plasma is about 1,000° to 1,300°C by a measurement by an insertion of chromel-alumel thermocouple into the plasma and at the time noting its thermal balance. By an exposure to the plasma discharge in a reaction time of about 10 seconds, the test piece is oxidized up to about 10 $\mu$ depth. During the reaction period, the vacuum oxygen atmosphere is maintained constant by introducing oxygen ($O_2$) gas.

FIGS. 2a–2e show cross-sections of various steps of the provision of the dielectric isolation according to the present invention.

FIG. 2a shows a first step of treatment. In this embodiment a semi-insulating gallium arsenide (GaAs) substrate 8 having resistivity of $10^6$ $\Omega$cm is used. Onto (100) surface of the gallium arsenide (GaAs) substrate 8, a gallium arsenide (GaAs) epitaxial layer 9 having the impurity density of about $10^{16}$ cm$^{-3}$ is provided by an epitaxial growth. Over the epitaxial layer 9, an aluminum (Al) layer 10 is applied by vacuum evaporation. The aluminum (Al) layer 10 is partially removed by a photoresist process as shown in FIG. 2b. This test piece in the condition as shown in FIG. 2b is brought into the reactor, for instance such as shown in FIG. 1, and is subjected to the plasma oxidation. By this process, an insulating oxidized film 11 is formed at the location of exposed gallium arsenide (GaAs) and the oxidized film 11 has a thickness exceeding the thickness of the gallium arsenide (GaAs) epitaxial layer 9. FIG. 2d shows a cross-section after the removal of the residual aluminum (Al) layer by hydrofluoric acid (HF). FIG. 2e shows a provision of ohmic electrodes 12 by evaporation of indium (In) at the upper surface of the gallium arsenide (GaAs) epitaxial layer 9 and 12' at the lower surface of the gallium arsenide (GaAs) substrate 8. The lower electrode 12' may be used as a ground terminal G of the device and each of the upper electrode 12 consists electrodes A, B and C of the device.

FIG. 3 illustrates insulation of GaAs islands made in accordance with the present practice as substantially mentioned by referring to FIGS. 2a–2e. In the present embodiment, the voltage to current characteristic was measured by contacting gold (Au) wires to the respective ohmic electrodes 12 and 12' and making upper electrode 12 as positive. The abcissa is the square root of the applied voltage V and the ordinate is taken by logarithmic scale of the current I. The dotted line curve (1) of FIG. 3 corresponds to measurement between electrodes A and G of FIG. 2e. The solid line curve (2) in FIG. 3 corresponds to the measurement between the electrodes A and B of FIG. 2e and the dash dot line curve (3) of FIG. 3 corresponds to that between electrodes A and C of FIG. 2e. The resistivity of the oxidized film 11 is about $10^8$–$10^{10}$ $\Omega$cm so that the current passing the oxidized layer 11 can substantially be neglected. Accordingly, the above current is considered dominantly formed by a current passing through the semi-insulating gallium arsenide (GaAs) substrate 8 so that it may be said that an ideal dielectric isolation is obtained.

Then as a further embodiment of the present invention, a case of provision of isolation and protection for a pn-junction diode of gallium arsenide (GaAs) will be explained by referring to FIGS. 4a–4d.

In FIG. 4a, 13 is an N-type gallium arsenide (GaAs) substrate having the impurity concentration of $10^{16}$ $cm^{-3}$ and (100) surface. On this N-type substrate 13, zinc (Zn) is diffused up to $10^{18}$ $cm^{-3}$ so as to form a P-type layer 14 of 1.5-1.7 $\mu$ thick. After applying an aluminum (Al) film 15 by evaporation over the whole surface of the P-type layer 14, the desired portion of the aluminum (Al) layer is removed by a photoresist process Then the sample is inroduced in the reactor as shown in FIG. 1 and is subjected to the plasma oxidation. By applying the plasma oxidation, the exposed portion of the gallium arsenide (GaAs) from the aluminum evaporated film is oxidized up to a depth exceeding the depth of pn-junction to form an oxidized film 16 as shown in FIG. 4b. The evaporated aluminum (Al) film 15 is removed as the same manner of the preceding example. Then indium (In) electrodes 17 and 17' are applied by evaporation. The voltage current characteristic of this sample obtained by a curve tracer is as shown by a dotted line curve B of FIG. 4d. Full line curve A of the same chart illustrates a voltage current characteristic of a sample which had not been applied the plasma oxidation process for the purpose of comparison. As can be seen from FIG. 4d, the sample which had been applied with the plasma oxidation process is observed to show a slight deterioration at the reverse voltage characteristic. However, this deterioration may be removed by further improvement of the plasma oxidation condition.

Separation and protection of pn-junction of a gallium arsenide phosphide ($GaAs_{1-x}P_x$; $x$=0.4) device can be carried out by selecting the oxygen pressure as 0.4–0.6 torr, and the high frequency anode voltage of 8 KV, just as the same process as the process of the pn-junction diode of the gallium arsenide (GaAs) sample. FIG. 5 shows some example of voltage current characteristic for such sample. In FIG. 5, dotted line curve B represents a result of plasma oxidation for a sample of N-type (100) surface gallium arsenide phosphide ($GaAs_{1-x}P_x$; $x$=0.4) having the impurity density of $10^{17}$ $cm^{-3}$ diffused with zinc (Zn) at $10^{20}$ $cm^{-3}$ so as to form P-type layer of 2.5 $\mu$ thick. In comparison thereto, curve A shows voltage current characteristic of the same sample but the plasma oxidation had not been applied. Also in this case the recognizable deterioration of the characteristic at the reverse voltage can be improved by taking the same measure as mentioned in the case of gallium arsenide (GaAs) pn-junction isolation.

The etching speed of the plasma oxidation film is in case of gallium arsenide (GaAs) about 50–80 A/min by hot hydrochloric acid (HCL) solution, and in case of gallium arsenide phosphide ($GaAs_{1-x}P_x$) or gallium phosphide (GaP) 500–1,000 A/min by 5% hydrofluoric acid (HF).

As substantially mentioned above, according to the present invention, the dielectric isolation of a compound semiconductor epitaxial layer on an semi-insulating substrate and separation and protection of pn-junction of a compound semiconductor can be realized in a very short time and simple manner by using an oxidizing atmosphere of the low density plasma.

What is claimed is:
1. A method for providing dielectric isolation of an epitaxial layer of a compound semiconductor of gallium arsenide (GaAs) comprising the steps of;
   a. forming a film of said compound semiconductor on an insulative or semi-insulative substrate,
   b. coating an aluminum (Al) mask layer by evaporation on the surface of the compound semiconductor film,
   c. selectively removing the aluminum (Al) mask layer by a photoresist process from an area where the compound semiconductor is to be oxidized,
   d. oxidizing the exposed area of removed aluminum (Al) of the compound semiconductor by placing it in a hot plasma produced by a high frequency hot plasma discharge at a temperature range of about 1,000°–1,300°C in an oxygen atmosphere of about 0.3 Torr until the oxidation is completed up to a depth to reach to the substrate, and
   e. removing the remaining aluminum (Al) mask by etching.

2. A method as claimed in claim 1, wherein the high frequency discharge is caused by a high frequency source operated at about 6–7 KV.

* * * * *